United States Patent
Hamada et al.

(10) Patent No.: US 9,691,714 B2
(45) Date of Patent: Jun. 27, 2017

(54) SEMICONDUCTOR DEVICE AND METHOD FOR MANUFACTURING SEMICONDUCTOR DEVICE

(71) Applicant: ROHM CO., LTD., Kyoto (JP)

(72) Inventors: Yoshihiro Hamada, Kyoto (JP); Yushi Sekiguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/955,028

(22) Filed: Nov. 30, 2015

(65) Prior Publication Data
US 2016/0155709 A1   Jun. 2, 2016

(30) Foreign Application Priority Data

Dec. 2, 2014   (JP) ................................ 2014-244373

(51) Int. Cl.
| | |
|---|---|
| H01L 23/522 | (2006.01) |
| H01L 23/31 | (2006.01) |
| H01L 21/768 | (2006.01) |
| H01L 29/94 | (2006.01) |
| H01L 23/00 | (2006.01) |

(52) U.S. Cl.
CPC ........ *H01L 23/562* (2013.01); *H01L 23/5223* (2013.01); *H01L 24/05* (2013.01); *H01L 23/3114* (2013.01); *H01L 2924/0002* (2013.01)

(58) Field of Classification Search
CPC .. H01L 23/562; H01L 21/76895; H01L 28/40
USPC ...................................................... 257/532
See application file for complete search history.

(56) References Cited

U.S. PATENT DOCUMENTS

| | | | | |
|---|---|---|---|---|
| 8,349,666 B1* | 1/2013 | Leal | ...................... | H01L 23/585 |
| | | | | 257/E21.59 |
| 2012/0199942 A1* | 8/2012 | Kageyama | .......... | H01L 23/5258 |
| | | | | 257/529 |
| 2013/0115749 A1* | 5/2013 | Chen | ...................... | H01L 21/486 |
| | | | | 438/386 |
| 2015/0108607 A1* | 4/2015 | Chen | ...................... | H01L 28/60 |
| | | | | 257/533 |
| 2016/0247757 A1* | 8/2016 | Tsai | ...................... | H01L 23/48 |

FOREIGN PATENT DOCUMENTS

JP      2013-026624 A      2/2013

* cited by examiner

*Primary Examiner* — Moazzam Hossain
*Assistant Examiner* — Omar Mojaddedi
(74) *Attorney, Agent, or Firm* — Rabin & Berdo, P.C.

(57) ABSTRACT

A semiconductor device of the present invention includes a first interlayer film having a first region and a second region, a MIM structure including a lower electrode formed on the second region, a first capacitance film formed on the lower electrode, and an upper electrode formed on the first capacitance film, a lower metal layer formed on the first region, and disposed in the same layer level with the lower electrode, an auxiliary metal layer disposed in the same layer level with the upper electrode, and opposed to the lower metal layer, a second interlayer film formed on the first interlayer film, and covering the auxiliary metal layer and the MIM structure, and a top metal layer formed on the second interlayer film, and penetrating through the second interlayer film to contact the auxiliary metal layer.

10 Claims, 12 Drawing Sheets

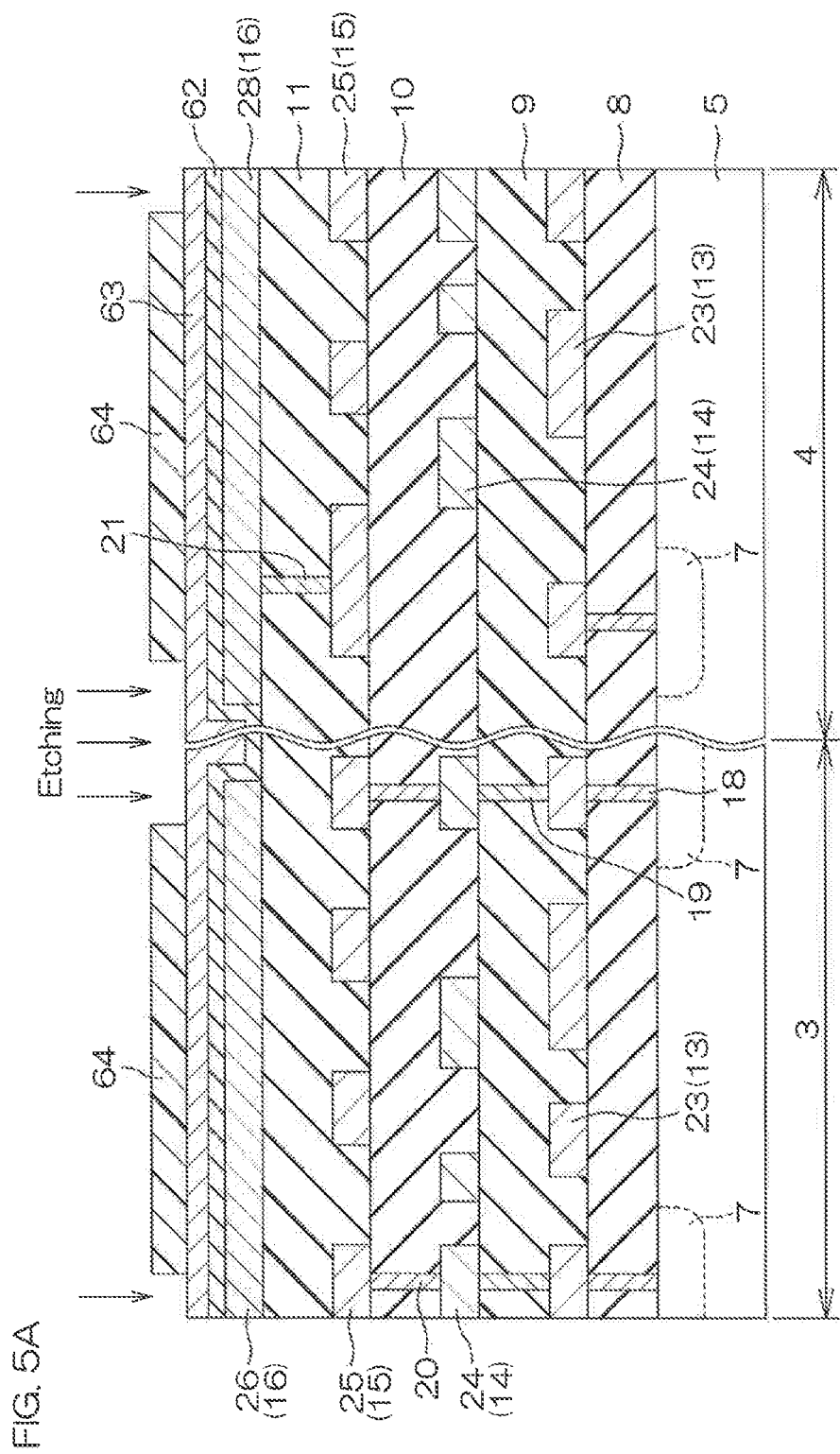

US 9,691,714 B2

SEMICONDUCTOR DEVICE AND METHOD FOR MANUFACTURING SEMICONDUCTOR DEVICE

CROSS-REFERENCE TO RELATED APPLICATIONS

The present application corresponds to Japanese Patent Application No. 2014-244373 filed in the Japan Patent Office on Dec. 2, 2014, and the entire disclosure of this application is incorporated herein by reference.

TECHNICAL FIELD

The present invention relates to a semiconductor device and a method for manufacturing the same.

BACKGROUND ART

Recently, as bonding wires to be used for semiconductor devices, use of copper wires that are lower in cost than gold wires has been considered. For example, Patent Document 1 (Japanese Patent Application Publication No. 2013-26624) is one of the documents that propose the use of copper wires.

SUMMARY OF INVENTION

However, because copper wires are harder than gold wires, it is necessary, when bonding a copper wire, to make a load and ultrasonic to be applied to the wire stronger than those when bonding a gold wire. Therefore, large damage is applied to an underlayer of a bonding pad (top metal layer), and the underlayer cracks in some cases.

Thickening the bonding pad unlimitedly may allow relaxing the load and ultrasonic by the bonding pad to reduce the damage to the underlayer. However, this countermeasure possibly causes a pattern failure of the bonding pad and is therefore difficult to be adopted. The problem of a pattern failure can be solved by laminating a plurality of metal layers to thicken the bonding pad, but two steps of (1) a step of depositing a metal material and (2) a step of etching said metal material are increased every time one metal layer is increased, and a rise in manufacturing cost is inevitable.

Therefore, it is an object of the present invention to provide a semiconductor device capable of preventing the occurrence of cracks in a region under the top metal layer at low cost and a method for manufacturing the same.

BRIEF DESCRIPTION OF DRAWINGS

FIG. 5A to FIG. 5G are views showing part of a process for manufacturing the semiconductor device in FIG. 1 to FIG. 4.

DESCRIPTION OF EMBODIMENTS

Figure 1:
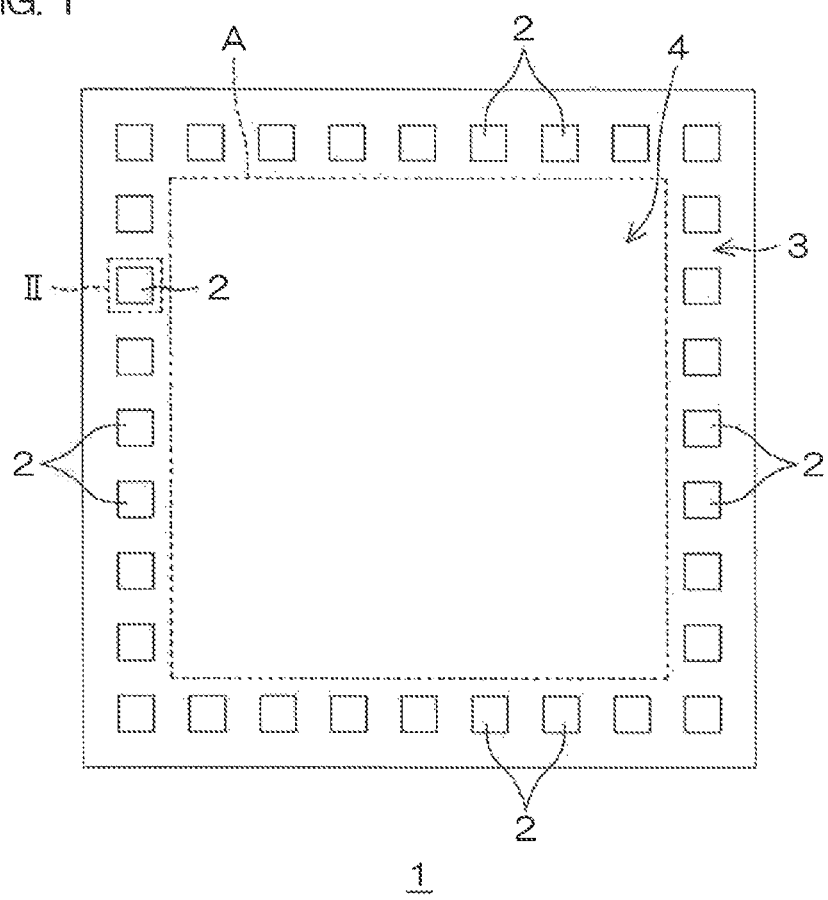
FIG. 1 is a schematic plan view of a semiconductor device showing a preferred embodiment of the present invention.

A semiconductor device of the present invention includes a first interlayer film having a first region and a second region, a MIM structure including a lower electrode formed on the second region, a first capacitance film formed on the lower electrode, and an upper electrode formed on the first capacitance film, a lower metal layer formed on the first region, and disposed in the same layer level with the lower electrode, an auxiliary metal layer disposed in the same layer level with the upper electrode, and opposed to the lower metal layer, a second interlayer film formed on the first interlayer film, and covering the auxiliary metal layer and the MIM structure, and a top metal layer formed on the second interlayer film, and penetrating through the second interlayer film to contact the auxiliary metal layer.

According to this arrangement, the auxiliary metal layer is disposed under the top metal layer to construct a laminated structure of the auxiliary metal layer/the top metal layer. The thickness of a metal film under the top metal layer from a front surface thereof can be made thicker by a thickness of the auxiliary metal layer than that of a single layer of the top metal layer. As a result, even if a relatively large load and ultrasonic is applied to a wire when bonding a wire to the top metal layer, impact thereof can be relaxed by said laminated metal structure. Therefore, the occurrence of cracks in a region under the top metal layer can be prevented. In addition, a member to be bonded to the top metal layer is not limited to a wire, and may be a plate-shaped clip and the like.

Furthermore, the auxiliary metal layer is disposed in the same layer level with the upper electrode of the MIM structure to be used as a part of an element of the semiconductor device. Therefore, the auxiliary metal layer can be formed, using a material for said upper electrode, by a step the same as that of the upper electrode. Thus, it is not necessary to add a new step in forming the auxiliary metal layer, and a rise in manufacturing cost can be suppressed.

A semiconductor device of the present invention may further include a second capacitance film formed between the auxiliary metal layer and the lower metal layer, and disposed in the same layer level with the first capacitance film.

According to this arrangement, impact due to a load and ultrasonic can be further relaxed also in the second capacitance film. Furthermore, because the second capacitance film can also be formed by a step the same as that of the first capacitance film of the MIM structure, a rise in manufacturing cost can be suppressed.

A semiconductor device of the present invention may further include an opening formed between the second interlayer film to expose the auxiliary metal layer, in which the top metal layer may enter the opening to be in contact with the auxiliary metal layer.

The top metal layer may have a recess portion formed at a position over the opening.

The opening may be tapered off toward the auxiliary metal layer.

When the top metal layer has a lead-out portion led out to an outside of the auxiliary metal layer in a plan view, a semiconductor device of the present invention may further include a via that penetrates through the second interlayer film and connects the lead-out portion and the lower metal layer.

According to this arrangement, by disposing the via to a peripheral edge portion excluding a central region of the top metal layer to which a wire is normally bonded, the via can be prevented from directly receiving impact when bonding a wire. As a result, the top metal layer and the lower metal layer can be improved in connection reliability.

The vias may be arrayed in plural numbers so as to surround the auxiliary metal layer.

In a semiconductor device of the present invention, the via may be made of tungsten, and the top metal layer may be made of a material different from tungsten.

A method for manufacturing a semiconductor device of the present invention includes a step of forming a first interlayer film having a first region and a second region, a step of forming a lower electrode on the second region, and forming a lower metal layer on the first region using a material for the lower electrode, a step of forming a first capacitance film on the lower electrode, a step of forming an upper electrode on the first capacitance film, and forming an auxiliary metal layer at a position opposed to the lower metal layer using a material for the upper electrode, a step of forming a second interlayer film on the first interlayer film so as to cover the upper electrode and the auxiliary metal layer, and a step of forming a top metal layer that penetrates through the second interlayer film and contacts the auxiliary metal layer.

By this method, a semiconductor device of the present invention can be manufactured.

A method for manufacturing a semiconductor device of the present invention may further include a step of, when forming the first capacitance film, forming a second capacitance film on the lower metal layer using a material for the first capacitance film.

A method for manufacturing a semiconductor device of the present invention may further include a step of, after forming the lower electrode and the lower metal layer, forming the upper electrode, the auxiliary metal layer, the first capacitance film, and the second capacitance film by successively laminating the material for the first capacitance film and the material for the upper electrode, and successively etching the materials with an identical pattern.

According to this method, a mask to pattern the upper electrode and the auxiliary metal layer and a mask to pattern the first capacitance film and the second capacitance film can be made common to each other. As a result, a rise in manufacturing cost can be further suppressed.

Hereinafter, preferred embodiments of the present invention will be described in detail with reference to accompanying drawings.

FIG. 1 is a schematic plan view of a semiconductor device 1 showing a preferred embodiment of the present invention.

The semiconductor device 1 has, for example, a quadrangular shape. In a peripheral edge portion of the semiconductor device 1, a plurality of electrode pads 2 as an example of a top metal layer of the present invention are arrayed. In the present preferred embodiment, the plurality of electrode pads 2 are arrayed, along each of the four sides of the semiconductor device 1, at mutually equal intervals.

Of a planar region of the semiconductor device 1, the peripheral edge portion in which the plurality of electrode pads 2 are disposed is defined as a pad region 3 as an example of a second region of the present invention, and a central portion surrounded by said pad region 3 is defined as an element region 4 as an example of a first region of the present invention. In FIG. 1, for the sake of clarification, the pad region 3 and the element region 4 are sectioned by a broken line A. The broken line A does not mean that a clear boundary exists between the regions 3 and 4.

The element region 4 is a region in which a plurality of elements to be mounted on the semiconductor device 1 are formed. The plurality of elements include, for example, a resistor element, a diode, etc., besides a MIM capacitor 27 and transistors 7 to be described later. In addition, the present invention does not exclude that an element is formed in the pad region 3 of the semiconductor device 1.

Figure 2:
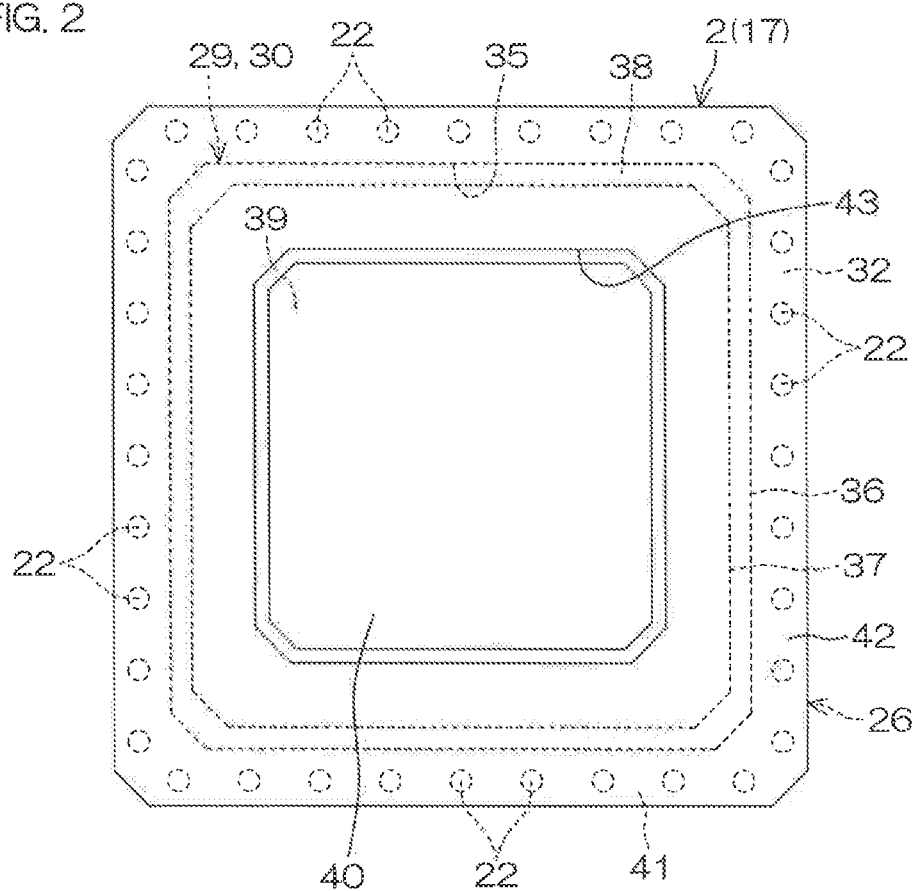
FIG. 2 is an enlarged view of a part surrounded by a broken line II in FIG. 1.
Figure 3:
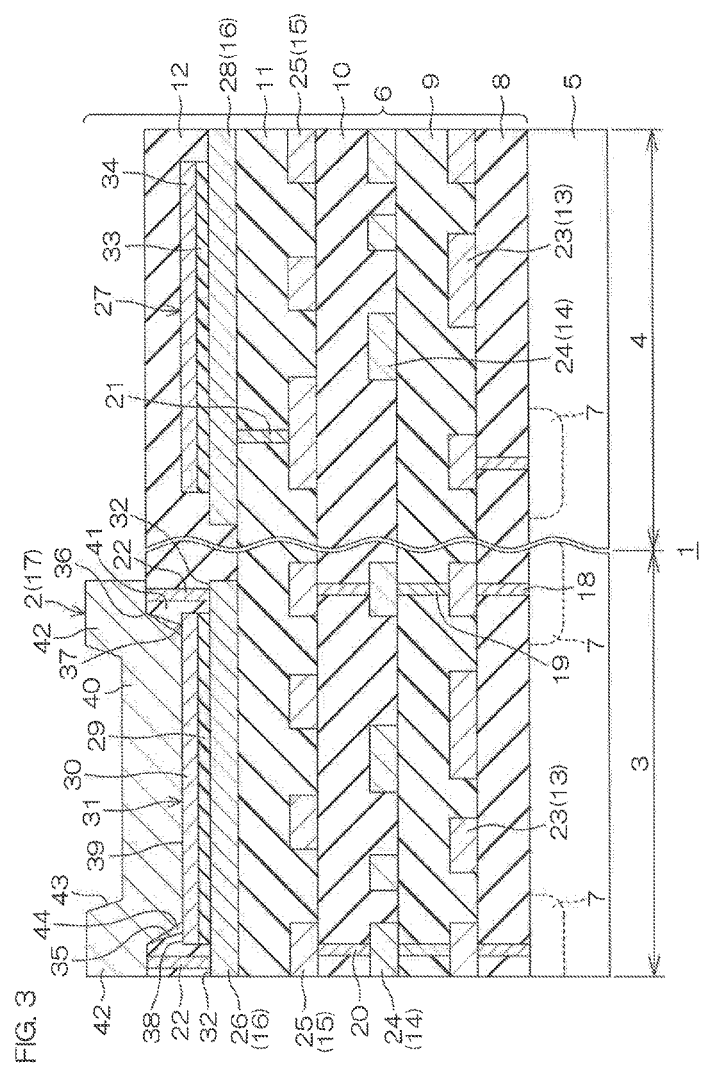
FIG. 3 is a schematic sectional view of the semiconductor device in FIG. 1.
Figure 4:
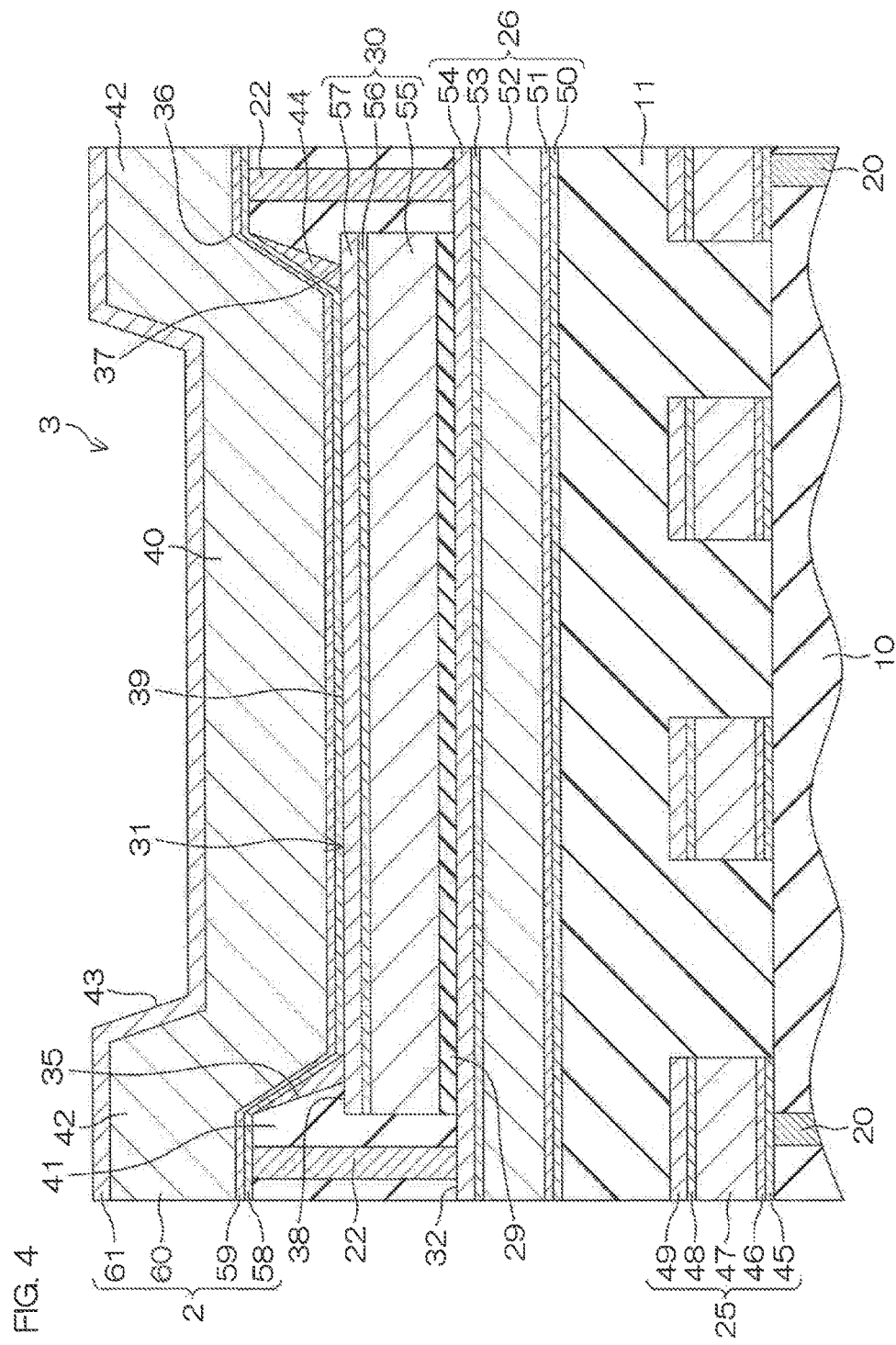
FIG. 4 is an enlarged view of a vicinity of an electrode pad in FIG. 3.

FIG. 2 is an enlarged view of a part surrounded by a broken line II in FIG. 1. FIG. 3 is a schematic sectional view of the semiconductor device 1 in FIG. 1. FIG. 4 is an enlarged view of a vicinity of the electrode pad 2 in FIG. 3.

The semiconductor device 1 includes a semiconductor substrate 5 and a multilayer wiring structure 6. The semiconductor substrate 5 is, for example, a silicon substrate. In the semiconductor substrate 5, transistors 7 (e.g., MOS-FETs) are formed.

The multilayer wiring structure 6, in the present preferred embodiment, includes first to fifth interlayer films 8 to 12 laminated on the semiconductor substrate 5, first to fifth metals 13 to 17 formed on the first to firth interlayer films 8 to 12, respectively, and first to fifth vias 18 to 22 penetrating through the first to fifth interlayer films 8 to 12, respectively. In addition, in the present preferred embodiment, a first interlayer film and a second interlayer film of the present invention described in the claims are defined as a fourth interlayer film 11 that is directly under an uppermost layer and a fifth interlayer film 12 that is the uppermost layer, respectively.

Each of the first to fifth metals 13 to 17 includes a wiring formed with a predetermined pattern, a capacitor electrode, a pad, a resistor element and/or the like, and those construct respective wiring layers together with the first to fifth vias 18 to 22. FIG. 3 shows, as examples of components of the respective wiring layers, in the first to third wiring layers, first to third wirings 23 to 25 constructed with the first to third metals 13 to 15, respectively. Also, in the fourth wiring layer, an under-pad wiring 26 as an example of a lower metal layer of the present invention constructed with the fourth metal 16 and a lower electrode 28 of a MIM capacitor 27 as an example of a MIM structure of the present invention are shown, and in the fifth wiring layer, the electrode pad 2 constructed with the fifth metal 17 (top metal) is shown.

In addition, a conductive material to construct the respective wiring layers does not need to be a metal material as in the present preferred embodiment, and may be a semiconductor material such as, for example, polysilicon. Also, in the present preferred embodiment, the first to fifth metals 13 to 17 are all formed on front surfaces of the first to firth interlayer films 8 to 12, but may be buried in the first to fifth interlayer films 8 to 12 by, for example, a damascene technique and the like.

Next, the construction of the fourth and fifth wiring layers will be described more specifically with reference to FIG. 2 and FIG. 3.

The under-pad wiring 26 to form the fourth wiring layer is disposed in the pad region 3. The under-pad wiring 26 is formed, as shown in, for example, FIG. 2, in a quadrangular shape in a plan view. On the under-pad wiring 26, an under-pad capacitance film 29 as an example of a second capacitance film of the present invention and a buried pad 30 as an example of an auxiliary metal layer of the present invention are laminated in this order. Directly under the electrode pad 2, an under-pad MIM structure 31 consisting of a laminated structure of the under-pad wiring 26 (metal)/the under-pad capacitance film 29 (insulator)/the buried pad 30 (metal) is thereby formed.

The under-pad capacitance film 29 and the buried pad 30 are formed, as shown in, for example, FIG. 2, in a quadrangular shape in a plan view, and are disposed in an inner region of the under-pad wiring 26. The under-pad wiring 26 that is large relative to the under-pad capacitance film 29 and the buried pad 30 accordingly has a contact region 32 that is led out sideways along the front surface of the fourth interlayer film 11. In the present preferred embodiment, the under-pad capacitance film 29 and the buried pad 30 have a peripheral edge retracted to the inside throughout its entire periphery with respect to a peripheral edge of the under-pad wiring 26. Thus, the contact region 32 is formed in an annular shape throughout the entire peripheral edge of the under-pad wiring 26.

Also, in the present preferred embodiment, the under-pad capacitance film 29 and the buried pad 30 are formed in the same shape and the same size as each other in a plan view. Due to this structure, the under-pad capacitance film 29 and the buried pad 30 have side surfaces formed to be flush with each other. In addition, the side surfaces of the under-pad capacitance film 29 and the buried pad 30 may not be flush with each other.

On the other hand, in the fourth wiring layer, the lower electrode 28 is disposed in the element region 4. On the lower electrode 28, a capacitor capacitance film 33 as an example of a first capacitance film of the present invention and an upper electrode 34 are laminated in this order. A MIM capacitor 27 consisting of a laminated structure of the lower electrode 28 (metal)/the capacitor capacitance film 33 (insulator)/the upper electrode 34 (metal) is thereby constructed in a position separated from the electrode pad 2. In the present preferred embodiment, the lower electrode 28, the capacitor capacitance film 33, and the upper electrode 34 of the MIM capacitor 27 are formed in the same shape and with the same thickness as the under-pad wiring 26, the under-pad capacitance film 29, and the buried pad 30, respectively. Also, the lower electrode 28 is, as shown in FIG. 3, electrically connected with the third wiring 25 by the fourth via 21.

Moreover, the fifth interlayer film 12 is formed on the fourth interlayer film 11 so as to cover the under-pad MIM structure 31 and the MIM capacitor 27. In the fifth interlayer film 12, a contact hole 35 is formed as an example of an opening of the present invention to expose the buried pad 30.

In the present preferred embodiment, the contact hole 35 is, as shown in FIG. 3, tapered off from an opening end 36 where it has substantially the same diameter as that of the buried pad 30 toward the buried pad 30, and has a diameter smaller than that of the buried pad 30 at a bottom portion 37. The contact hole 35 accordingly selectively exposes a central portion 39 of the buried pad 30 so that a peripheral edge portion 38 of the buried pad 30 is covered with the fifth interlayer film 12.

The electrode pad 2 to form the fifth wiring layer enters the contact hole 35 to contact the buried pad 30. The electrode pad 2 integrally includes a buried portion 40 in the contact hole 35 and an overlapping portion 42 as an example of a lead-out portion of the present invention on a peripheral edge portion 41 of the contact hole 35.

Because the buried portion 40 and the overlapping portion 42 are formed with the same thickness, between an upper surface of the buried portion 40 and an upper surface of the overlapping portion 42, a step is formed due to a thickness of the fifth interlayer film 12. The electrode pad 2 accordingly has at a position over the buried portion 40 a bonding region 43 as an example of a recess portion of the present invention depressed with respect to the overlapping portion 42. In the present preferred embodiment, the overlapping portion 42 is formed in an annular shape throughout the entire periphery of the peripheral edge portion 41 of the contact hole 35, and this construction forms the bonding region 43 surrounded by the overlapping portion 42.

The overlapping portion 42 is opposed to the contact region 32 of the under-pad wiring 26 across the fifth interlayer film 12. The overlapping portion 42 and the contact region 32 are electrically connected therebetween by the fifth via 22 that penetrates through the fifth interlayer film 12. The fifth vias 22 are, in the present preferred embodiment, as shown in FIG. 2, formed in plural numbers at mutually equal intervals along the peripheral edge of the under-pad wiring 26, to surround the buried pad 30. By thus disposing the fifth vias 22 to the overlapping portion 42 excluding the bonding region 43, the fifth vias 22 can be prevented from directly receiving impact when bonding a wire. As a result, the electrode pad 2 and the under-pad wiring 26 can be improved in connection reliability.

Also, in the present preferred embodiment, a side-surface thin film 44 is formed between the electrode pad 2 and a side surface (tapered surface) of the contact hole 35. The side-surface thin film 44 is selectively formed on the side surface of the contact hole 35 out of the bottom and side surfaces thereof.

Also, although not shown in FIG. 3, on the fifth interlayer film 12, a surface protective film (e.g., a silicon nitride (SiN) film) having a pad opening to selectively expose the electrode pad 2 may be formed.

Next, referring to FIG. 4, a detailed structure of components of the multilayer wiring structure 6 will be described by raising the third to fifth wiring layers in the pad region 3 as an example.

The third and fourth interlayer films 10 and 11 are made of, for example, silicon oxide ($SiO_2$), and have a thickness of 7500 Å to 9500 Å. This construction can also be applied to the first and second interlayer films 8 and 9.

The fifth interlayer film 12 is made of, for example, silicon oxide ($SiO_2$), and has a thickness of 9000 Å to 11000 Å.

The third wiring 25 includes, for example, a Ti layer 45, a TiN layer 46, an AlCu layer 47, a Ti layer 48, and a TiN layer 49 in order from the lower side. As the thicknesses of the respective layers, the Ti layer 45 is 50 Å to 150 Å, the TiN layer 46 is 50 Å to 150 Å, the AlCu layer 47 is 4500 Å to 5500 Å, the Ti layer 48 is 50 Å to 150 Å, and the TiN layer 49 is 350 Å to 450 Å. This construction can also be applied to the first and second wirings 23 and 24.

The under-pad wiring 26 includes, for example, a Ti layer 50, a TiN layer 51, an AlCu layer 52, a Ti layer 53, and a TiN layer 54 in order from the lower side. As the thicknesses of the respective layers, the Ti layer 50 is 50 Å to 150 Å, the TiN layer 51 is 50 Å to 150 Å, the AlCu layer 52 is 4500 Å to 5500 Å, the Ti layer 53 is 50 Å to 150 Å, and the TiN layer 54 is 350 Å to 450 Å. This construction can also be applied to the lower electrode 28.

The under-pad capacitance film 29 is made of, for example, silicon oxide ($SiO_2$), and has a thickness of 350 Å to 400 Å. This construction can also be applied to the capacitor capacitance film 33.

The buried pad 30 includes, for example, an AlCu layer 55, a Ti layer 56, and a TiN layer 57 in order from the lower side. As the thicknesses of the respective layers, the AlCu layer 55 is 800 Å to 1200 Å, the Ti layer 56 is 50 Å to 150 Å, and the TiN layer 57 is 350 Å to 450 Å. This construction can also be applied to the upper electrode 34.

The fifth via 22 and the side-surface thin film 44 are made of, for example, tungsten (W). This construction can also be applied to the first to fourth vias 18 to 21.

The electrode pad 2 includes, for example, a Ti layer 58, a TiN layer 59, an AlCu layer 60, and a TiN layer 61 in order from the lower side. As the thicknesses of the respective layers, the Ti layer 58 is 50 Å to 150 Å, the TiN layer 59 is 50 Å to 150 Å, and the AlCu layer 60 is 9000 Å to 9500 Å, and the TiN layer 61 is 350 Å to 450 Å.

In addition, the construction materials and their layer thicknesses described above are mere examples, and can be appropriately optimized according to the specifications etc., of the semiconductor device 1.

FIG. 5A to FIG. 5G are views showing part of a process for manufacturing the semiconductor device 1 in FIG. 1 to FIG. 4 in the order of steps.

Figure 5B:
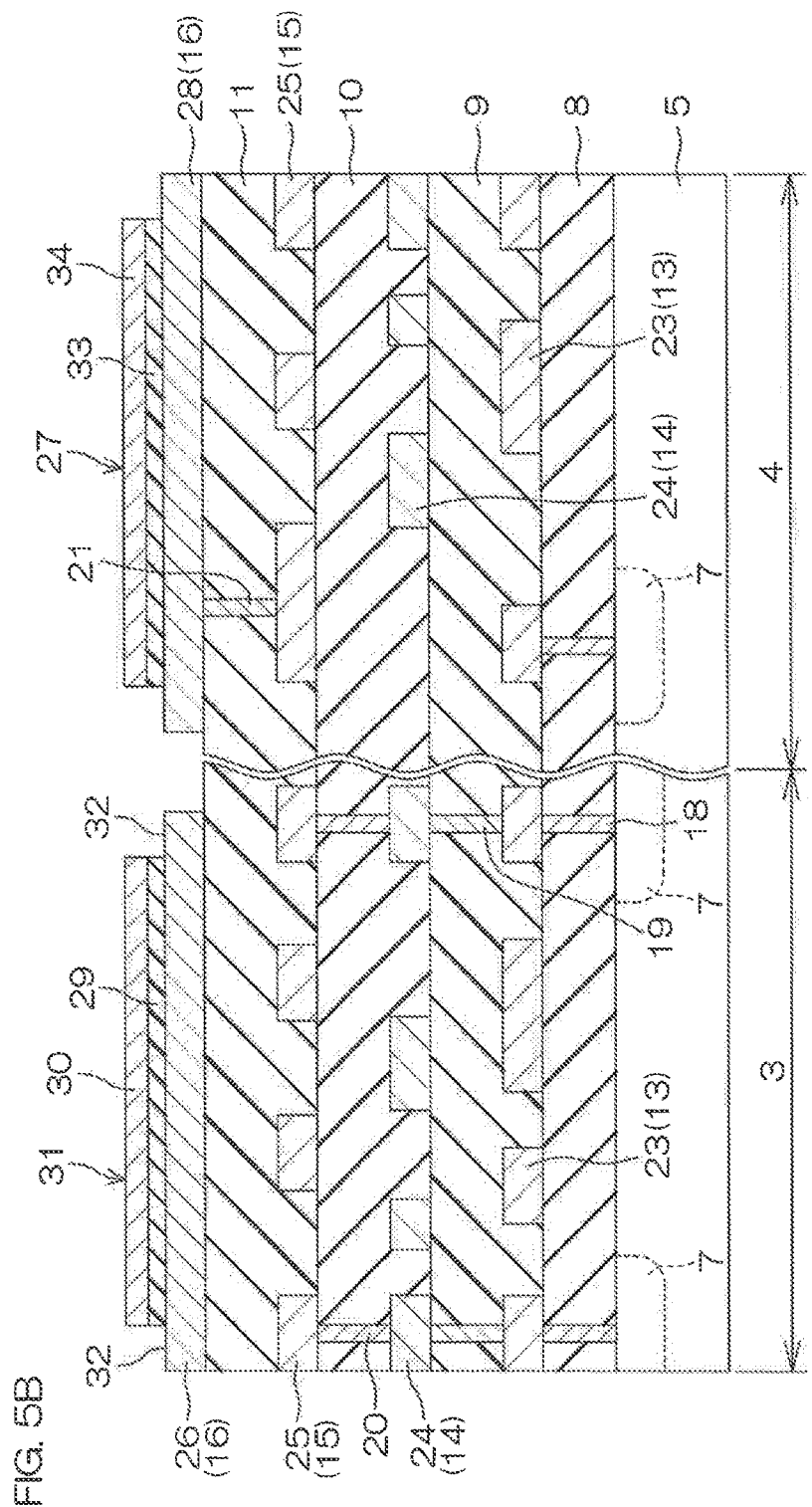

For manufacturing the semiconductor device 1, as shown in FIG. 5A, after formation up to the fourth interlayer film 11 on the semiconductor substrate 5, the materials (including, for example, the AlCu layer 52) for the fourth metal 16 are laminated by, for example, a sputtering method, in order on the entire front surface of the fourth interlayer film 11. Next, the fourth metal 16 is selectively etched to simultaneously form the under-pad wiring 26 and the lower electrode 28. Next, a capacitance film material 62 is laminated by, for example, a CVD method, and successively thereto, an upper electrode material 63 is laminated by, for example, a sputtering method. Next, a mask 64 with a predetermined pattern is formed on the upper electrode material 63, and the upper electrode material 63 and the capacitance film material 62 are successively etched using the mask 64. As shown in FIG. 5B, the under-pad capacitance film 29, the buried pad 30, the capacitor capacitance film 33, and the upper electrode 34 are thereby simultaneously formed. That is, the MIM capacitor 27 is formed, and simultaneously, the under-pad MIM structure 31 is formed. In this step, the MIM capacitor 27 and the under-pad MIM structure 31 can be simultaneously formed using the common mask 64, so that arise in manufacturing cost can be suppressed.

Figure 5C:
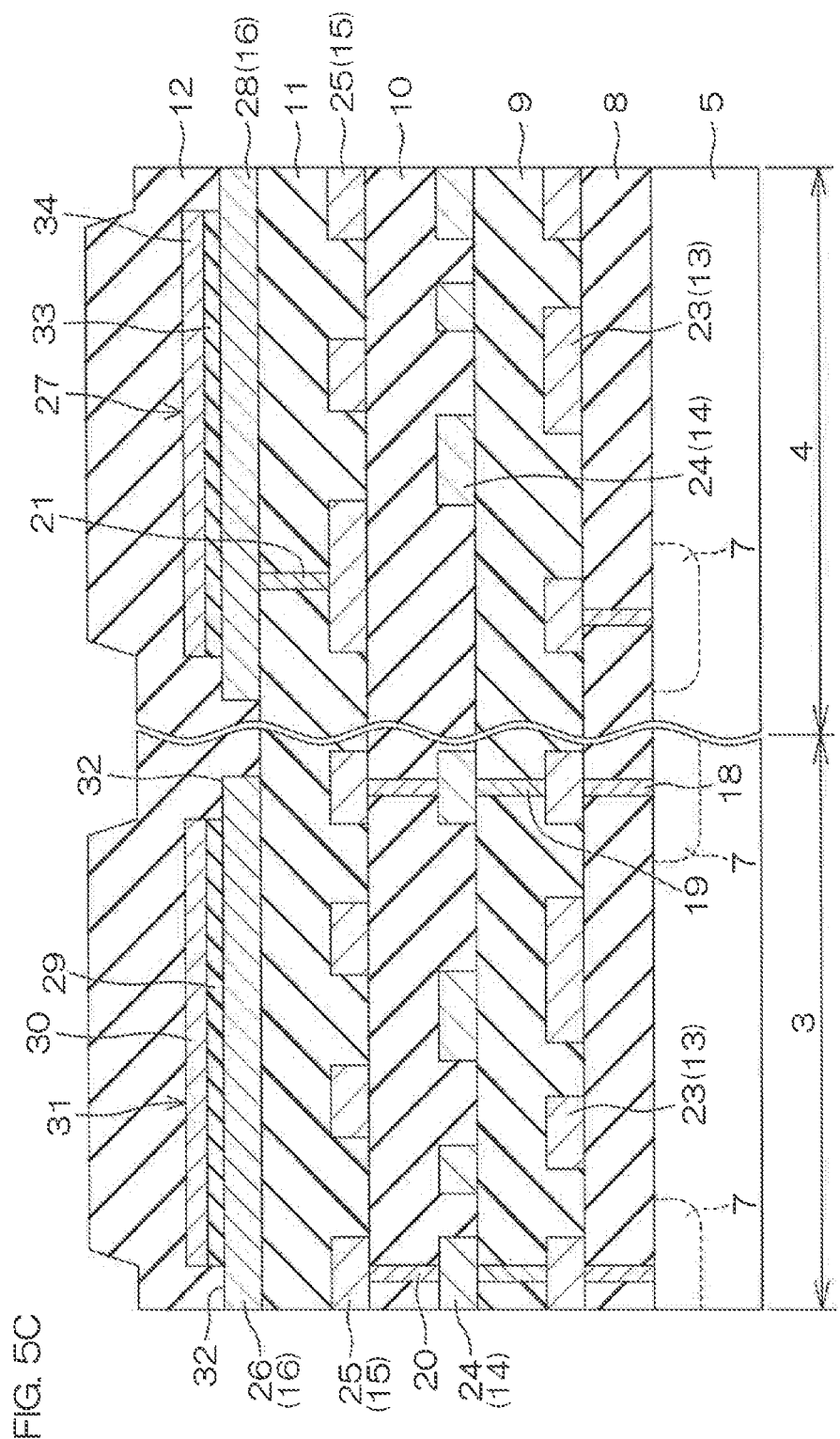

Next, as shown in FIG. 5C, in a manner of covering the MIM capacitor 27 and the under-pad MIM structure 31, the fifth interlayer film 12 is laminated by, for example, a CVD method. The part of the fifth interlayer film 12 projecting due to the thickness of the MIM capacitor 27 and the under-pad MIM structure 31 is selectively polished by CMP. The fifth interlayer film 12 is thereby flattened at its front surface.

Figure 5D:
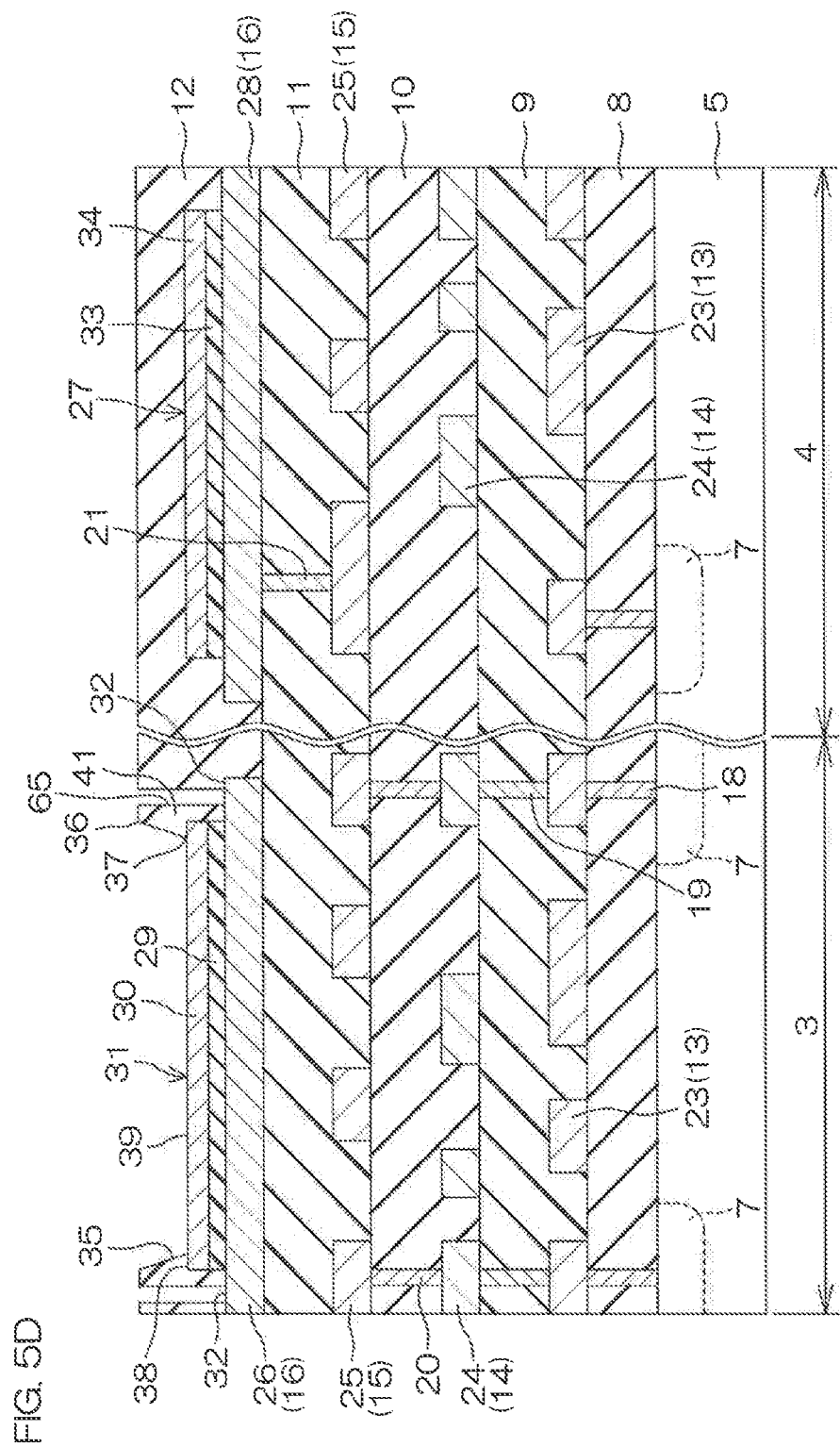

Next, as shown in FIG. 5D, the fifth interlayer film 12 is selectively etched to simultaneously form a contact hole 65 for making contact with the under-pad wiring 26 and the contact hole 35.

Figure 5E:
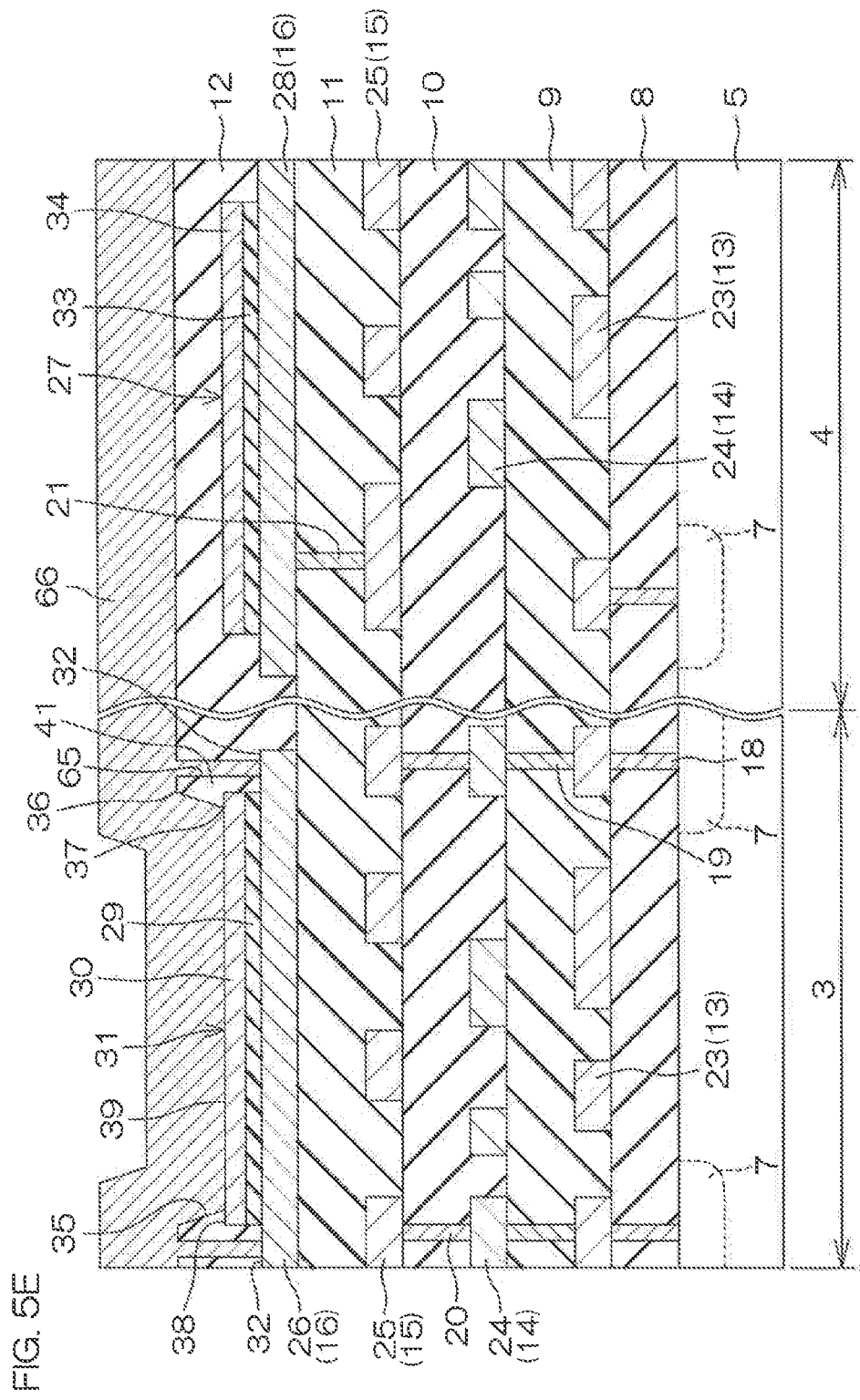

Next, as shown in FIG. 5E, a via material 66 (e.g., a tungsten film) is laminated by, for example, a sputtering method, on the entire front surface of the fifth interlayer film 12. The contact hole 65 and the contact hole 35 are thereby filled back with the via material 66.

Figure 5F:
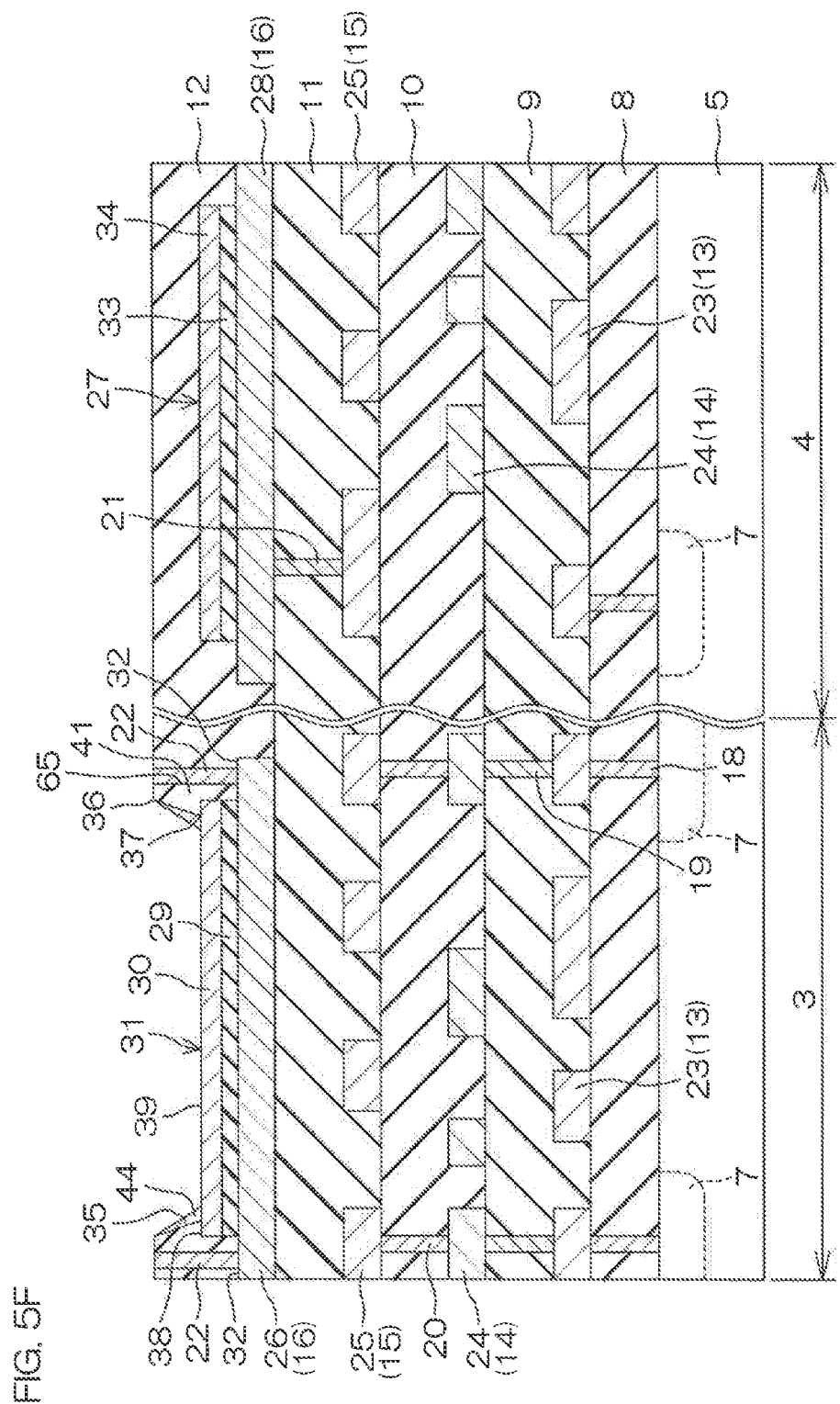

Next, as shown in FIG. 5F, the via material 66 is etched back. Not only is the via material 66 on the fifth interlayer film 12 thereby removed, but the via material 66 in the contact hole 35 being a large opening relative to the contact hole 65 is also removed. Not only is the central portion 39 of the buried pad 30 thereby exposed, but the fifth via 22 for which tungsten is filled in the contact hole 65 is also obtained. At this time, a residual of the via material 66 on the side surface of the contact hole 35 remains as the side-surface thin film 44.

Figure 5G:
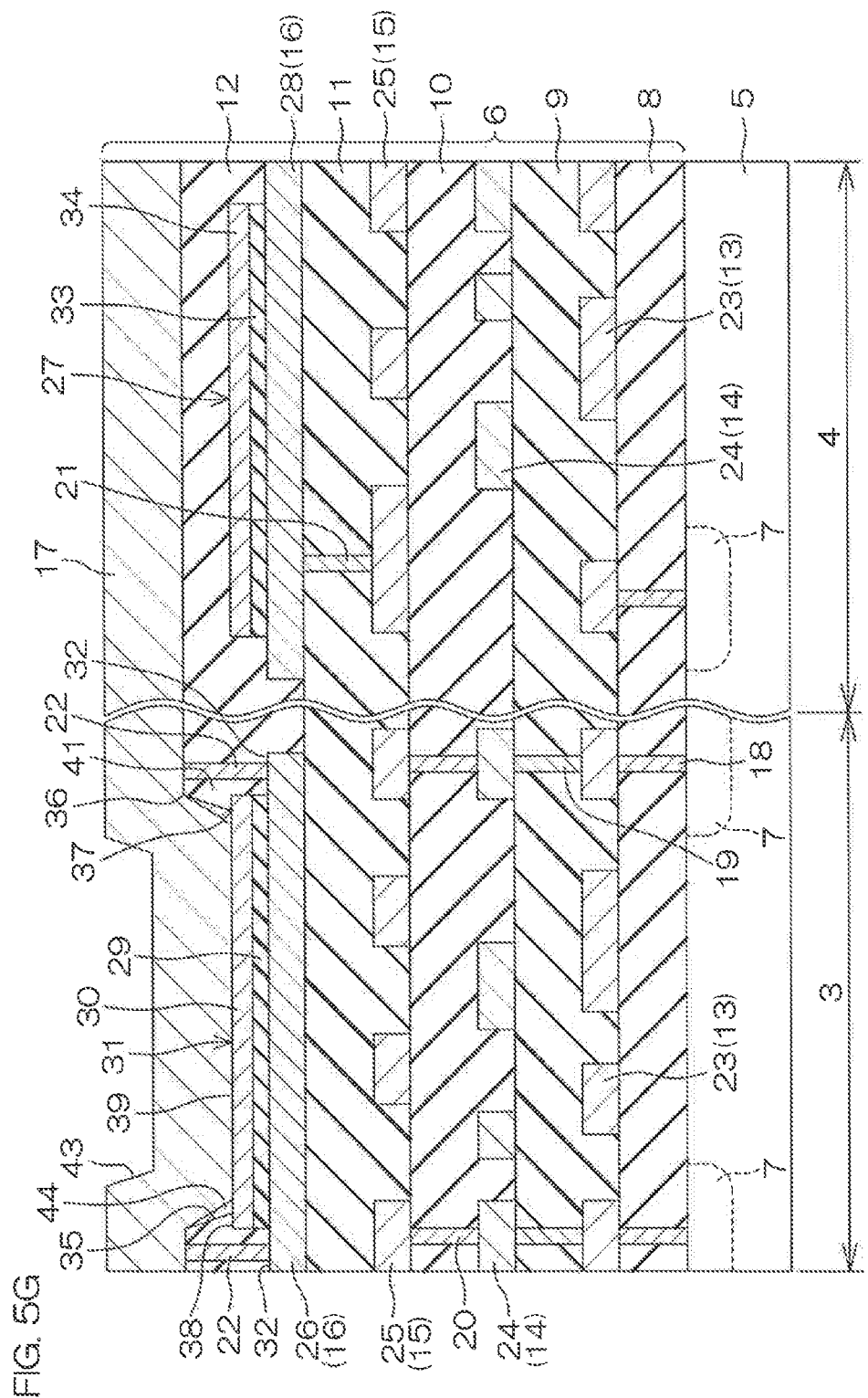

Next, as shown in FIG. 5G, the materials (including, for example, the AlCu layer 60) for the fifth metal 17 are laminated by, for example, a sputtering method, in order on the entire front surface of the fifth interlayer film 12. Thereafter, by the fifth metal 17 being selectively etched, the electrode pad 2 is formed.

The semiconductor device 1 is obtained through the above steps.

As above, according to the present semiconductor device 1, as shown in FIG. 3, the buried pad 30 is disposed under the electrode pad 2 (top metal) to construct a laminated structure of the buried pad 30/the electrode pad 2. The thickness of a metal film under the electrode pad 2 from the front surface thereof can be made thicker by a thickness of the buried pad 30 than that of a single layer of the electrode pad 2. That is, the thickness of a metal film under the bonding region 43 can be provided as a total thickness of the electrode pad 2 and the buried pad 30. As a result, even if a relatively large load and ultrasonic is applied to a wire when bonding a wire to the electrode pad 2, impact thereof can be relaxed by said laminated metal structure. Therefore, the occurrence of cracks in a region under the electrode pad 2 can be prevented.

Figure 6:
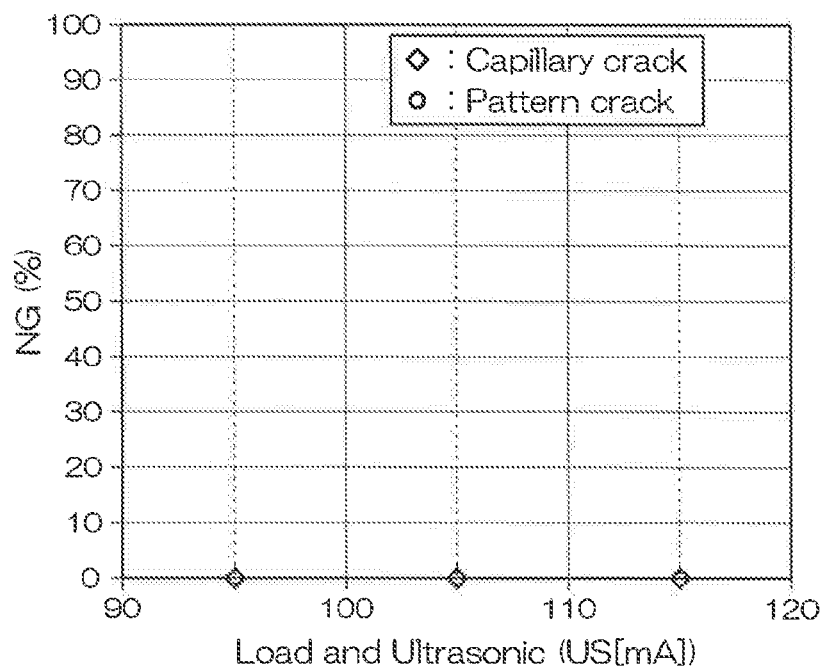
FIG. 6 is a graph showing verification results (examples) of a crack prevention effect.
Figure 7:
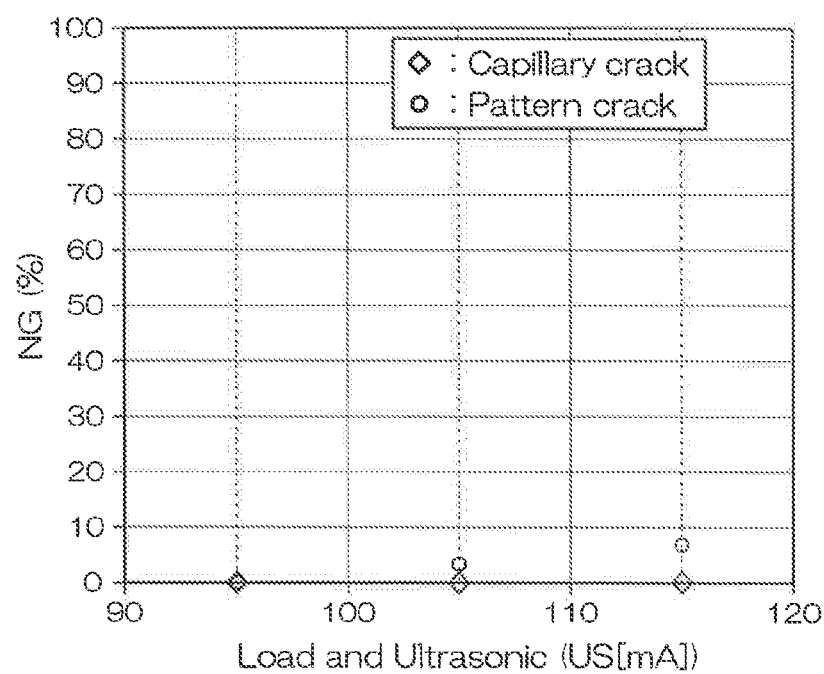
FIG. 7 is a graph showing verification results (comparative examples) of a crack prevention effect.

FIG. 6 and FIG. 7 are verification results of the crack prevention effects. FIG. 6 shows a case where a laminated structure of the buried pad 30/the electrode pad 2 is "present," and FIG. 7 shows a case where it is "absent." In FIG. 6 and FIG. 7, the capillary crack means a crack that has occurred along a ball-bonding circular shape of a bonding wire (copper wire). On the other hand, the pattern crack means a crack that has occurred, on the electrode pad 2, along a metal pattern such as a wiring pattern.

As shown in FIG. 6, in devices having laminated structures of the buried pad 30/the electrode pad 2, capillary cracks and pattern cracks have not occurred at all regardless of the magnitude of a load and ultrasonic. In contrast thereto, as shown in FIG. 7, in devices without said laminated structures, pattern cracks have occurred with an increase in load and ultrasonic. Also, at this time, while whether there is barrier stripping (example: a phenomenon where the TiN layer 61 being a front-most surface of the electrode pad 2 is stripped) has also been verified, barrier stripping has not occurred at all in the structures of FIG. 6.

Moreover, the buried pad 30 to prevent the occurrence of such cracks is disposed in the same layer level with the upper electrode 34 of the MIM capacitor 27 to be used as a part of an element of the semiconductor device 1. Therefore, as shown in FIG. 5A and FIG. 5B, the buried pad 30 can be formed, using the upper electrode material 63, by the same step as that of the upper electrode 34. Thus, in forming the buried pad 30, it suffices to replace a mask having been used to form a MIM capacitor in conventional steps, and it is not necessary to add a new step. As a result, a rise in manufacturing cost can be suppressed.

Although a preferred embodiment of the present invention has been described above, the present invention can also be carried out in other modes.

For example, a bonding member to be bonded to the bonding region 43 is not limited to a copper wire and may be a gold wire.

Also, bonding to the bonding region 43 may be performed by clip bonding using a plate-shaped clip.

Also, because the occurrence of cracks can be sufficiently prevented if there is a buried pad 30, in the foregoing preferred embodiment, the under-pad capacitance film 29 directly under the electrode pad 2 may be omitted. That is, a MIM structure may not be formed under the electrode pad 2. However, with a construction having the under-pad capacitance film 29, a benefit can be enjoyed that successive etching using the common mask 64 shown in FIG. 5A and FIG. 5B can be performed.

Also, the contact hole 35 may not be tapered off toward the buried pad 30, and may be, for example, constant in diameter toward the buried pad 30.

Various other design modifications can be applied within the scope of the matters described in the claims.

What is claimed is:

1. A semiconductor device comprising:
   a first interlayer film having a first region and a second region;
   a MIM structure including a lower electrode formed on the second region, a first capacitance film formed on the lower electrode, and an upper electrode formed on the first capacitance film;
   a lower metal layer formed on the first region, the lower metal layer disposed in the same layer level with the lower electrode;
   an auxiliary metal layer disposed in the same layer level with the upper electrode, the auxiliary metal layer being opposed to the lower metal layer;
   a second interlayer film formed on the first interlayer film, covering the auxiliary metal layer and the MIM structure;
   a top metal layer formed on the second interlayer film, and penetrating through the second interlayer film to contact the auxiliary metal layer, the top metal layer having a lead-out portion led out to an outside of the auxiliary metal layer in a plan view;
   a second capacitance film sandwiched between the auxiliary metal layer and the lower metal layer, the second capacitance film disposed in the same layer level with the first capacitance film; and
   a plurality of vias that penetrate through the second interlayer film,
   wherein the lower metal layer, the second capacitance film and the auxiliary metal layer define a second MIM structure disposed beneath the top metal layer,
   wherein in the plan view, the lower metal layer has an annular shaped contact region led out to an outside of the auxiliary metal layer and surrounding an entire peripheral edge of the auxiliary metal layer throughout the entire peripheral edge of the auxiliary metal layer,
   wherein the plurality of vias connects the lead-out portion and the contact region to each other, and
   the vias are arrayed at intervals throughout an entire peripheral edge of the lower metal layer.

2. The semiconductor device according to claim 1, wherein an opening is formed between portions of the second interlayer film, to expose the auxiliary metal layer, wherein
   the top metal layer enters the opening to be in contact with the auxiliary metal layer.

3. The semiconductor device according to claim 2, wherein the top metal layer has a recess portion formed at a position over the opening.

4. The semiconductor device according to claim 2, wherein the opening is tapered off toward the auxiliary metal layer.

5. The semiconductor device according to claim 1, wherein the plurality of vias is made of tungsten, and
   the top metal layer is made of a material different from tungsten.

6. A method for manufacturing a semiconductor device comprising:
   a step of forming a first interlayer film having a first region and a second region;
   a step of forming a lower electrode on the second region, and forming a lower metal layer on the first region using a material for the lower electrode;
   a step of forming a first capacitance film on the lower electrode;
   a step of forming an upper electrode on the first capacitance film, and forming an auxiliary metal layer at a position opposed to the lower metal layer using a material for the upper electrode;
   a step of forming a second interlayer film on the first interlayer film so as to cover the upper electrode and the auxiliary metal layer;
   a step of forming a top metal layer that penetrates through the second interlayer film and contacts the auxiliary metal layer, the top metal layer having a lead-out portion led out to an outside of the auxiliary metal layer in a plan view;
   a step of forming a second capacitance film sandwiched between the auxiliary metal layer and the lower metal layer, the second capacitance film disposed in the same layer level with the first capacitance film; and
   forming a plurality of vias that penetrate through the second interlayer film,
   wherein the lower metal layer, the second capacitance film and the auxiliary metal layer define a second MIM structure disposed beneath the top metal layer,
   wherein in the plan view, the lower metal layer has an annular shaped contact region led out to an outside of the auxiliary metal layer and surrounding an entire peripheral edge of the auxiliary metal layer throughout the entire peripheral edge of the auxiliary metal layer,
   wherein the plurality of vias connects the lead-out portion and the contact region to each other, and
   the vias are arrayed at intervals throughout an entire peripheral edge of the lower metal layer.

7. The method for manufacturing a semiconductor device according to claim 6, wherein when forming the first capacitance film, also forming the second capacitance film on the lower metal layer using a material for the first capacitance film.

8. The method for manufacturing a semiconductor device according to claim 7, further comprising a step of, after forming the lower electrode and the lower metal layer, forming the upper electrode, the auxiliary metal layer, the first capacitance film, and the second capacitance film by successively laminating the material for the first capacitance film and the material for the upper electrode, and successively etching the materials with an identical pattern.

9. The method for manufacturing a semiconductor device according to claim 7, wherein in the step of forming the auxiliary metal layer, the auxiliary metal layer is disposed to be directly above the lower metal layer.

10. The semiconductor device according to claim 1, wherein the auxiliary metal layer is disposed to be directly above the lower metal layer.

* * * * *